(12) United States Patent
Sumino

(10) Patent No.: US 8,853,663 B2
(45) Date of Patent: Oct. 7, 2014

(54) NONVOLATILE MEMORY DEVICE AND MANUFACTURING METHOD THEREOF

(75) Inventor: Jun Sumino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/252,690

(22) Filed: Oct. 4, 2011

(65) Prior Publication Data

US 2012/0091423 A1 Apr. 19, 2012

(30) Foreign Application Priority Data

Oct. 14, 2010 (JP) ................. 2010-231214

(51) Int. Cl.
*H01L 21/8239* (2006.01)
*H01L 45/00* (2006.01)
*G11C 13/00* (2006.01)

(52) U.S. Cl.
CPC ............ *H01L 45/144* (2013.01); *H01L 45/146* (2013.01); *G11C 13/0002* (2013.01); *H01L 45/147* (2013.01); *H01L 45/1286* (2013.01); *H01L 45/1233* (2013.01)
USPC ................. 257/4; 257/1; 257/2; 257/3; 257/5; 438/381

(58) Field of Classification Search
CPC ............... H01L 21/8239; H01L 45/14–45/144

USPC .......................................... 257/1–5; 365/163
See application file for complete search history.

(56) References Cited

U.S. PATENT DOCUMENTS

| 7,556,869 B2* | 7/2009 | Fukushima et al. .......... 428/816 |
| 2007/0108488 A1* | 5/2007 | Suh et al. ....................... 257/295 |
| 2009/0140232 A1* | 6/2009 | Ufert ................................. 257/4 |
| 2009/0173930 A1* | 7/2009 | Yasuda et al. ..................... 257/4 |
| 2009/0200640 A1* | 8/2009 | Hosoi et al. .................... 257/536 |
| 2009/0236581 A1* | 9/2009 | Yoshida et al. .................... 257/2 |
| 2010/0091563 A1* | 4/2010 | Zheng et al. .................. 365/171 |

FOREIGN PATENT DOCUMENTS

| JP | 2003-068983 | 3/2003 |
| JP | 2005-166976 | 6/2005 |
| JP | 2005-197634 | 7/2005 |
| JP | 2005-322942 | 11/2005 |

* cited by examiner

*Primary Examiner* — Julia Slutsker
*Assistant Examiner* — Natalia Gondarenko
(74) *Attorney, Agent, or Firm* — Dentons US LLP

(57) ABSTRACT

A nonvolatile memory device is disclosed, in which a first electrode, a first material layer having a positive Peltier coefficient, an information storage layer, a second material layer having a negative Peltier coefficient, and a second electrode are laminated.

14 Claims, 8 Drawing Sheets

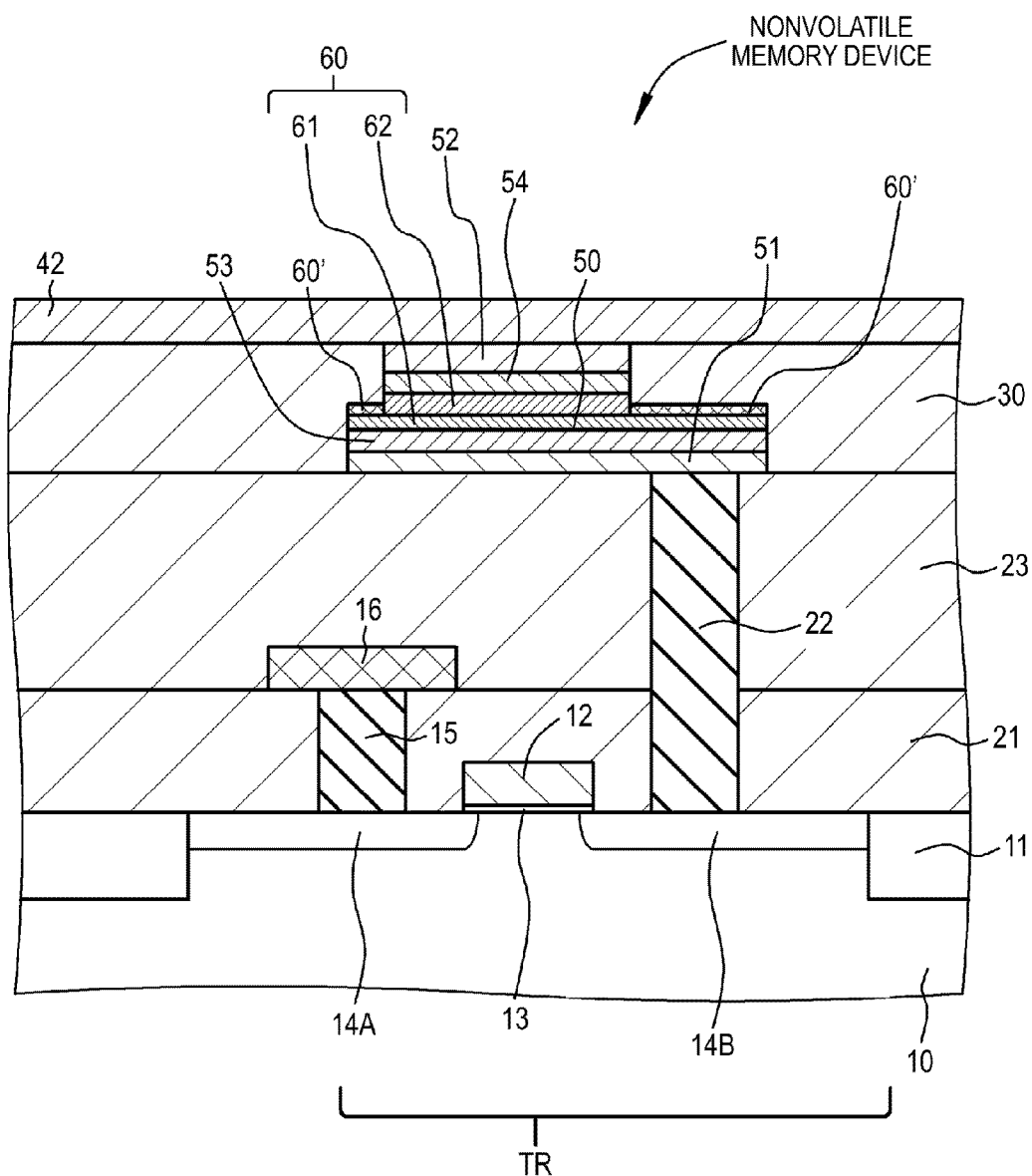

[PROCESS-120]

[PROCESS-120] (CONTINUED)

[PROCESS-130]

[PROCESS-130] (CONTINUED)

[PROCESS-130] (CONTINUED)

NONVOLATILE MEMORY DEVICE AND MANUFACTURING METHOD THEREOF

FIELD

The present disclosure relates to a nonvolatile memory device and a manufacturing method thereof.

BACKGROUND

Currently, a semiconductor device having nonvolatile memory cells, such as an EEPROM (Electrically Erasable and Programmable ROM) or a flash memory, is generally used in diverse fields. The number of rewrites thereon, improvement of reliability such as data retention tolerance, and miniaturization of the structure are important subjects. On the other hand, a flash memory that is represented as a floating type that is in the marketplace has recently attracted attention since it is said that a resistance change nonvolatile memory device has a high reliability in addition to a simple structure, a high-speed rewrite function, and multi-value technology, and is suitable for high performance and high integration.

Since a nonvolatile memory device including a phase change RAM (PRAM) has a structure in which a resistance change layer that functions as a memory portion is arranged between two electrodes, the memory structure is simple, and easy miniaturization is possible. The phase change memory device is a nonvolatile memory device that is operated as a memory device using the fact that a phase change material that forms a resistance change layer has different electrical resistances of several orders depending on whether the phase change material is in an amorphous state or in a crystal state (for example, see JP-A-2007-134676). Further, there is a nonvolatile memory device that stores data using a colossal electro-resistance effect (CER effect) of a material that forms a resistance change layer (for example, see JP-A-2003-068983). Further, there is a nonvolatile memory device in which a resistance change layer is formed from an ionic conductor that includes a metal (for example, see JP-A-2005-166976 and JP-A-2005-197634). Further, as a kind of nonvolatile memory device, a PMC (Programmable Metallization Cell) is known (for example, see JP-A-2005-322942).

However, in order to achieve a large capacity of a nonvolatile memory device through the leading semiconductor process, low voltage and low current are highly necessary. This is because as the drive transistor is miniaturized, its drive current and voltage become lowered. That is, in order to realize a miniaturized nonvolatile memory device, it is necessary that the nonvolatile memory device has a performance capable of being driven by miniaturized transistors. Further, in order to perform low-current driving, a low-current and high-speed (short pulse in the nanosecond order) write/read performance becomes necessary.

SUMMARY

However, in a nonvolatile memory device, the high-speed rewrite (switching) performance and the data retention tolerance are in a tradeoff relationship. In particular, if the rewrite property at a low voltage and a low current is the object, a margin between the write voltage and the read voltage becomes small, and repeated reading may change the resistance state. That is, change of the stored data that is a so-called a read disturbance phenomenon occurs.

Thus, it is desirable to provide a nonvolatile memory device and a manufacturing method thereof, which can suppress the occurrence of a read disturbance phenomenon.

An embodiment of the present disclosure is directed to a nonvolatile memory device in which a first electrode, a first material layer having a positive Peltier coefficient, an information storage layer, a second material layer having a negative Peltier coefficient, and a second electrode are laminated.

Another embodiment of the present disclosure is directed to a method of manufacturing a nonvolatile memory device which includes sequentially forming a first electrode, a first material layer having a positive Peltier coefficient, an information storage layer, a second material layer having a negative Peltier coefficient, and a second electrode on a substrate.

According to the nonvolatile memory device and the manufacturing method thereof according to the embodiments of the present disclosure, the nonvolatile memory device has a structure in which the information storage layer is inserted between the first material layer having the positive Peltier coefficient and the second material layer having the negative Peltier coefficient, and when current flows from the second electrode to the first electrode to read the information stored in the nonvolatile memory device, temperature increase of the information storage layer due to Joule heat maybe suppressed. Therefore, it becomes possible to suppress the occurrence of a read disturbance phenomenon in which the resistance state is changed while the reading of information is repeated.

BRIEF DESCRIPTION OF THE DRAWINGS

FIG. 1 is a schematic partial cross-sectional view of a nonvolatile memory device according to embodiment 1;

DETAILED DESCRIPTION

Figure 2A:
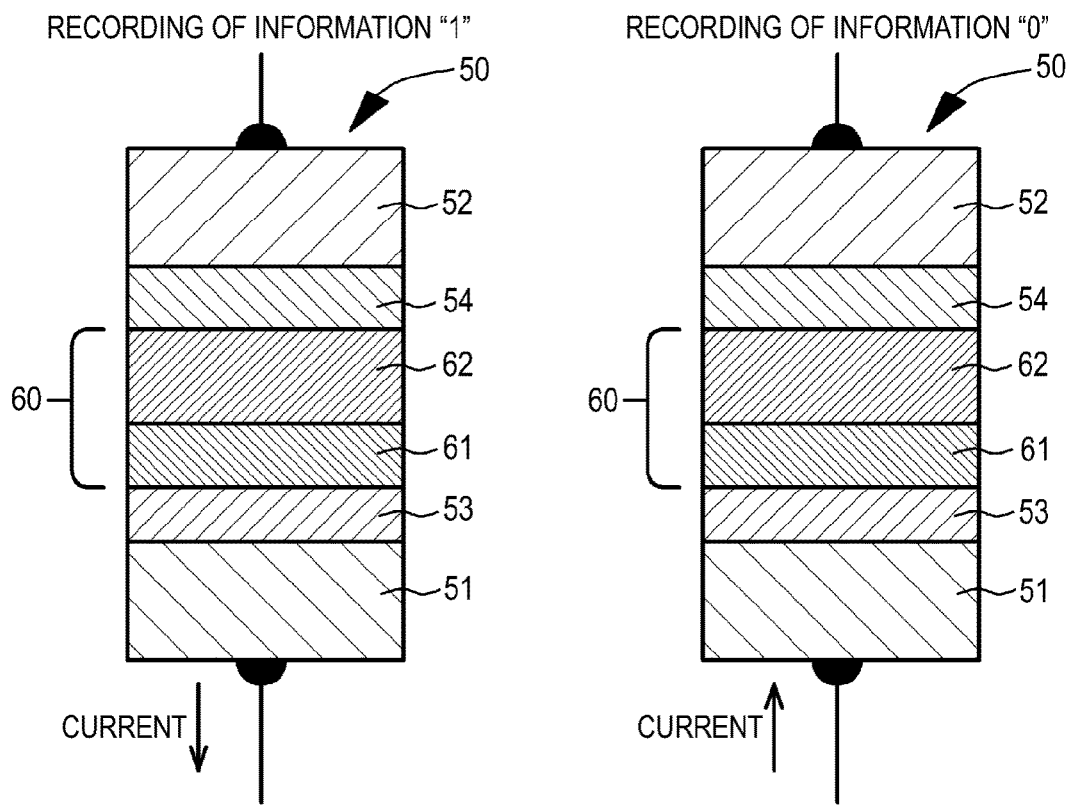
FIGS. 2A and 2B are views conceptually illustrating a cross-sectional structure of a multilayer structure that constitutes a nonvolatile memory device and its equivalent circuit diagram according to embodiment 1.

Hereinafter, with reference to the accompanying drawings, embodiments of the present disclosure will be described. However, the present disclosure is not limited to the embodiment, and diverse numeral values and materials in the embodiment are exemplary. The explanation thereof will be made in the following order.

1. Nonvolatile memory device and manufacturing method thereof according to embodiment of the present disclosure, and general explanations thereof 2. Embodiment 1 (nonvolatile memory device and manufacturing method thereof)

3. Embodiment 2 (modification of embodiment 1)

4. Embodiment 3 (another modification of embodiment 1) and others

[Nonvolatile Memory Device and Manufacturing Method Thereof According to Embodiment of the Present Disclosure, and General Explanations Thereof]

In a nonvolatile memory device according to an embodiment of the present disclosure or a nonvolatile memory device obtained by a manufacturing method thereof according to an embodiment of the present disclosure, a first material layer may be formed by a p-type thermoelectric material, and a second material layer may be formed by a n-type thermoelectric material.

In the nonvolatile memory device according to the embodiment of the present disclosure or a nonvolatile memory device obtained by the manufacturing method thereof according to the embodiment of the present disclosure, a material that forms a first electrode may be different from a material that forms a second electrode, and in this case, it is preferable that a Seebeck coefficient of the material that forms the first electrode is different from a Seebeck coefficient of the material that forms the second electrode. Here, specifically, the material that forms the first electrode is a material selected from the group consisting of silver, gold, copper, lead, palladium, platinum, titanium, titanium nitride, and tungsten, an alloy including any one of these materials, or a compound including any one of these materials. The material that forms the second electrode is different from the material that forms the first electrode, and may be a material selected from the group consisting of silver, gold, copper, lead, palladium, platinum, titanium, titanium nitride, and tungsten, an alloy including any one of these materials, or a compound including any one of these materials. The first electrode and the second electrode, for example, may be formed by a PVD method that is exemplified by a sputtering method.

In the nonvolatile memory device including the above-described shape and construction or the nonvolatile memory device obtained by the manufacturing method thereof according to the embodiment of the present disclosure, an information storage layer may be composed of a resistance change layer that stores information as its electrical resistance value (hereinafter referred to as a "resistance value") is changed. That is, the nonvolatile memory device or the nonvolatile memory device obtained by the manufacturing method thereof may be configured as a resistance change nonvolatile memory device. In this case, the resistance change layer may be formed of an ionic conductor that includes metal, or may be formed of a chalcogenide material. Further, the resistance change layer may be formed of a material having a colossal electro-resistance effect (CER effect). Alternatively, the nonvolatile memory device may be configured by a phase change memory device (PRAM) or a PMC (Programmable metallization Cell), which operates as a memory device using the phenomenon that the phase change material forming the resistance change layer varies by several digits of electrical resistance value between an amorphous state and a crystallized state.

In the case of forming the resistance change layer with an ionic conductor that includes metal, specifically, the resistance change material may be formed of a conductive or semiconductive thin film (for example, a multilayer structure of a thin film made of GeSbTe, GeTe, GeSe, GeS, SiGeTe, or SiGeSbTe and a thin film made of Ag, Ag alloy, Cu, Cu alloy, Zn, or Zn alloy) which includes at least one kind of element (atom) that is selected from the group consisting of copper (Cu), silver (Ag), and zinc (Zn) and at least one kind of element (chalcogen) (an atom) that is selected from the group consisting of tellurium (Te), sulfur (S), and selenium (Se). Further, the whole or a part in the film thickness direction of the resistance change layer may be formed of a thin film (rare earth oxide thin film) which includes an oxide of at least one kind of rare earth element that is selected from the group consisting of La, Ce, Pr, Nd, Sm, Eu, Gd, Tb, Dy, Ho, Er, Yb, and Y or an oxide thin film of Hf, Ta, or W. Further, the resistance change layer may be composed of a multilayer structure of a high resistance layer and an ionic source layer.

Further, in the case where the resistance change layer has a multilayer structure of the high resistance layer and the ionic source layer, the high resistance layer includes tellurium (Te) in the largest quantity as an anion component, and the ionic source layer includes at least one kind of metallic element as a positively ionizable element, and includes at least one kind of element (chalcogen) (atom) selected from the group consisting of tellurium (Te), sulfur (S), and selenium (Se) as a negatively ionizable element. The metallic element and the chalcogen are combined to form a metallic chalcogenide layer (chalcogenide material layer). The metallic calcogenide layer mainly has an amorphous structure, and serves as an ion source. The ionic source layer is formed to have a resistance value that is smaller than that of the high resistance layer in an initial state or in an erased state. The high resistance layer may have a single layer structure or a double layer structure, and in this case, the lower layer thereof that includes tellurium in the largest quantity as an anion component is in contact with the electrode on the high resistance layer side, and the upper layer thereof includes an element as an anion component except for tellurium.

It is preferable that the metallic element that forms the metallic chalcogenide layer is a chemically stable element that can exist in a metallic state in the ionic source layer that includes the above-described chalcogen so as to form a conduction path (filament) in the metallic state, and such metallic elements may be transition metals in groups 4A, 5A, and 6A in the periodic table, that is, Ti (titanium), Zr (zirconium), Hf (hafnium), V (Vanadium), Nb (Niobium), Ta (tantalum), Cr (chromium), Mo (Molybdenum), and W (tungsten). One kind or two kinds or more of these elements may be used to form the metallic chalcogenide layer. Further, Al (aluminum), Cu (copper), Ge (germanium), and Si (silicon) may be added to the ionic source layer.

Specific constituent materials of the ionic source layer, for example, may be ZrTeAl, TiTeAl, CrTeAl, WTeAl, and TaTeAl. Further examples, are ZrTeAl, CuZrTeAl with added Cu, CuZrTeAlGe with additional Ge, or CuZrTeAlSiGe with additional Si as an additional element may be included. Further, ZrTeMg that uses Mg instead of Al may be included. Even in the case of selecting another transition element such as titanium (Ti), tantalum (Ta), or the like, instead of zirconium (Zr), as the metallic element that forms the metallic chalcogenide layer, it is possible to use the same additional element, and a concrete constituent material of the ionic source layer, for example, TaTeAlGe or the like may be included. Further, in addition to tellurium (Te), Sulfur (S), selenium (Se), iodine (I), or the like may be used, and as the concrete constituent material of the ionic source layer, ZrSAl, ZrSeAl, or ZeIAl may be included.

Further, by constituting the metallic element that forms the metallic chalcogenide layer as a metallic element (M) that is easy to react on tellurium (Te) that is included in the high resistance layer, a stabilized structure so called a M.Te/ionic source layer can be obtained by heating the laminated structure so called a Te/ionic source layer (including metallic element M) after thin film forming. Here, as the metallic element (M) that is easy to react on tellurium (Te), for example, aluminum (Al) or magnesium (Mg) may be used.

In this case, another element may be added to the ionic source layer for the purpose of suppressing the pill-off during high-temperature heat treatment when the resistance change layer is formed. For example, silicon (Si) is an additional element from which improvement of the retention property can be expected, and for example, it is preferable to add silicon to the ionic source layer together with zirconium (Zr). However, if an addition amount of silicon (Si) is too small, the pill-off prevention effect may not be expected, while if the addition amount of silicon is too large, a preferable memory operation characteristic may not be obtained. Accordingly, it is preferable that the content of silicon (Si) in the ionic source layer is within the range of about 10 to 45 atom %.

The high resistance layer has a function as a barrier on the electrical conductivity, and when a predetermined voltage is applied between the electrode on the high resistance layer side and the electrode on the ionic source layer side, the high resistance layer shows a higher resistance value than the ionic source layer. The high resistance layer, for example, includes a layer which includes a compound that is mainly composed of tellurium (Te) that behaves as an anion component. Concretely, such a compound may be, for example, AlTe, MgTe, ZnTe, or the like. In the composition of the compound that contains tellurium (Te), for example, it is preferable that the content of aluminum (Al) in AlTe is equal to or larger than 20 atom % and equal to or smaller than 60 atom %. Further, the high resistance layer may include an oxide such as aluminum oxide ($Al_2O_3$). Further, it is preferable that the initial resistance value of the high resistance layer is equal to or larger than 1 MΩ, and the resistance value in the low resistance state is equal to or smaller than several hundreds of kΩ. That is, the nonvolatile memory device according to the embodiment of the present disclosure stores information by changing the resistance value of the high resistance layer. In order to read the resistance state of the miniaturized nonvolatile memory device at high speed, it is preferable to lower the resistance value in a low resistance state as far as possible. However, since the resistance value is 40 kΩ to 100 kΩ in the case of writing information (data) on conditions of 20 µA to 50 µA, 2 V, it is prerequisited that the initial resistance value of the nonvolatile memory device is higher than this value. Further, in consideration of the resistance separation width of a single-digit range, it is considered that the above-described resistance value is appropriate.

Here, if it is assumed that tellurium (Te) is contained in the largest quantity in the high resistance layer as an anion component, the metallic element that is diffused onto the high resistance layer is stabilized while the high resistance layer is in a low resistance state, and it becomes easy to hold the low resistance state. On the other hand, since the tellurium (Te) forms a weak bond with the metallic element in comparison to the oxide or silicon compound, and thus the metallic element that is diffused into the high resistance layer is easy to move to the ionic source layer, the erasing property is improved. That is, the retention property of the written data in the low resistance state is improved, and low voltage retention during data erasing becomes possible. Further, with respect to a large number of write/erase operations, it is possible to reduce a difference in resistance value in the erased state. At this time, in general, since the absolute value of the electronegativity becomes larger in the order of tellurium<selenium<sulfur<oxygen in the chalcogenide compound, the improvement effect is heightened as oxygen becomes lower in the high resistance layer and the chalcogenide having low electronegativity is used.

A material that forms the electrode on the high resistance layer side, for example, may be W (tungsten), WN (tungsten nitride), Cu (copper), Al (aluminum), Mo (molybdenum), Ta (tantalum), or silicide. At this time, in the case where the electrode on the high resistance layer side is formed of a material that has a possibility of ion conduction in the electric field, such as copper (Cu), the surface of the electrode on the high resistance layer side may be covered with a material in which ion conduction or heat diffusion is difficult, such as tungsten (W), tungsten nitride (WN), titanium nitride (TiN), and tantalum nitride (TaN). When the ion source layer contains Al (aluminum), examples of the constituent material of the electrode include a metal film containing at least one kind of material ionized less than Al (aluminum), for example, a metal thin film including at least one kind of Cr (chrome), W (tungsten), Co (cobalt), Si (silicon), Au (gold), Pd (palladium), Mo (molybdenum), Ir (iridium), and Ti (titanium), or their oxide film or nitride film. As the electrode on the ionic source layer side, a known conduction material may be used in the same manner as the electrode on the high resistance layer side.

At the time of storing (writing) information, a "positive direction" (for example, the high resistance layer has a negative potential, and the ionic source layer side has a positive potential) voltage pulse is applied to the nonvolatile memory device in an initial state (high resistance state). As a result, the resistance of the information storage layer is lowered (information storage state). Thereafter, even when the application of the voltage to the nonvolatile memory device is stopped, the information storage layer is retained in the low-resistance state. Accordingly, information is written and retained. In the case of using a storage device that can be written only once, so called a PROM (Programmable Read Only Memory), information recording is completed by this information recording process. In the case of application to a storage device in which information can be rewritten multiple times, that is, a RAM (Random Access Memory) or EEPROM, a rewritable process is necessary. In the case of rewriting information, a "negative direction" (for example, the high resistance layer has a positive potential, and the ionic source layer side has a negative potential) voltage pulse is applied to the nonvolatile memory device in a low resistance state. As a result, the resistance of the information storage layer is heightened (initial state or erased state). Thereafter, even when the application of the voltage to the nonvolatile memory device is stopped, the information storage layer is retained in a high resistance state. Accordingly, the written information is erased. By repeating this process, writing of information on the nonvolatile memory device and the erasing of the written information can be repeatedly performed. In reading the information stored in the nonvolatile memory device, for example, the "positive direction" (for example, the high resistance layer has a negative potential, and the ionic source side has a positive potential) voltage is applied, but the value is lower than the voltage value that is applied when the information is stored (written). For example, by making the high resistance state and the low resistance state correspond to information "0" and information "1", respectively, the information is changed from "0" to "1" in the information writing process, and the information is changed from "1" to "0" in the information erasing process. In this case, the operation for the low resistance state and the operation for the high resistance state correspond to the write operation and the erase operation, respectively. However, the resistance states which are opposite to the above-described states may correspond to the erase operation and the write operation.

In the case of forming the resistance change layer with a chalcogenide material, the chalcogenide material may be a metal such as GeSbTe, ZnSe, or GaSnTe and a compound such as Se or Te. Further, in the case of forming the resistance change layer with a material having the colossal electro-resistance effect (CER effect), a related material may be a ternary perovskite phase type transition metal oxide (Pr-CaMnO$_3$ or SrTiO$_3$), or a binary transition metal oxide (CiO, NiO, CuO, TlO$_2$, or Fe$_3$O$_4$).

Further, the nonvolatile memory device maybe formed of a nonvolatile magnetic memory device having a magnetoresistive effect. Specifically, such a nonvolatile memory device may be a current field inversion type tunnel magnetoresistive effect device (MRAM) or spin magnetoresistive effect device (spin SRAM) applying magnetization inversion by spin injection. In the latter, in-plane magnetization and perpendicular magnetization are included.

Here, in the spin magnetiresistive effect device, an information storage layer is provided, which has a multilayer structure having a TMR effect by a magnetization reference layer (which is called a pinned layer or a magnetization pinned layer), a tunnel insulating layer, and a recording layer storing information (which is also called a magnetization inversion layer or a free layer). The information storage layer is inserted between the first material layer and the second material layer. In this case, the information storage layer which has a multilayer structure having a TMR effect may also be constructed by the magnetization reference layer, the tunnel insulating layer, the recording layer, the tunnel insulating layer, and the magnetization reference layer. In the above-described structure, it is necessary to have a difference in magnetoresistive change between two tunnel insulating layers which are positioned on the upper and lower portions of the recording layer. The tunnel insulating layer serves to turn off the magnetic coupling between the recording layer and the magnetization reference layer and to make a tunnel current flow. Further, by making the magnetization direction shifted to the first direction (which is parallel to the easy magnetization axis) or the second direction (which is opposite to the first direction) through injection of the spin-polarized current into the recording layer, the information is written to the recording layer (in-plane magnetization). Further, by making the spin-polarized current flow to the magnetization reference layer, spin-polarized electrons flow from the recording layer to the magnetization reference layer. Specifically, the electrons having a spin that is parallel to the magnetization reference layer passes through while the electron having a spin that is anti-parallel to the magnetization reference layer are reflected, resulting in that the magnetization direction of the recording layer and the magnetization direction of the magnetization reference layer are arranged in anti-parallel to each other (perpendicular magnetization).

The material that forms a recording layer or a magnetization reference layer in a nonvolatile memory device having a magnetoresistance effect may be a ferromagnetic material such as nickel (Ni), iron (Fe), or cobalt (Co), an alloy of these ferromagnetic materials (for example, Co—Fe, Co—Fe—Ni, Fe—Pt, Ni—Fe, or the like), an alloy (for example, Co—Fe—B or the like) that is obtained by mixing a nonmagnetic element (for example, tantalum, boron, chrome, platinum, silicon, carbon, nitride, or the like) with the alloy of these materials, an oxide including one kind or more of Co, Fe, Ni (for example, ferrite: Fe—MnO or the like), an intermetallic compound group that is called a half-metallic ferromagnetic material (Heusler alloy: NiMnSb, Co$_2$MnGe, Co$_2$MnSi, Co$_2$CrAl, or the like), or an oxide (for example, (La, Sr)MnO$_3$, CrO$_2$, Fe$_3$O$_4$, or the like). Further, an alloy that is obtained by adding gadolinium (Gd) to the alloy may be exemplified. Further, in order to further increase the perpendicular magnetic anisotropy, heavy rare earth element such as terbium (Tb), dysprosium (Dy), or holmium (Ho) may be added to the related alloy or an alloy that includes them may be laminated. Crystallization of the recording layer and the magnetization reference layer is essentially optional, and may be polycrystalline, monocrystalline, or amorphous. Further, a material that forms the magnetization reference layer may be, for example, Co—Tb or Co—Pt in addition to the above-described material. Further, the material may have a laminated ferry structure (a multilayer structure having an antiferromagnetic coupling which is also called synthetic antiferromagnet (SAF), may have a static magnetic coupling structure), or an antiferromagnetic layer may be arranged to be adjacent to the magnetization reference layer. By arranging the antiferromagnetic layer to be adjacent to the magnetization reference layer, a strong unidirectional magnetic anisotropy can be obtained by the exchange coupling between the two layers. The laminated ferry structure, for example, indicates a three-layer structure of a magnetic layer/ruthenium (Ru) layer/magnetic layer (specifically, for example, three-layer structure of CoFe/Ru/CoFe or three-layer structure of CoFeB/Ru/CoFeB) in which the interlayer exchange coupling of two magnetic layers become antiferromagnetic or ferromagnetic by the thickness of the ruthenium layer, and for example, is reported in S. S. Parkin et al, Physical Review Letters, 7 May, pp 2304-2307 (1990). Further, in the two magnetic layers, a structure in which antiferromagnetic coupling is obtained by magnetic field leakage from the cross-section surface of the magnetic layer is called a static magnetic coupling structure. A material that forms the antiferromagnetic layer may be an iron-manganese alloy, a nickel-manganese alloy, a platinum-manganese alloy, an iridium-manganese alloy, a rhodium-manganese alloy, a cobalt oxide, or a nickel oxide. In order to improve the crystalline of the antiferromagnetic layer, an underlayer composed of Ta, Cr, Ru, Ti, or the like may be formed between the first material layer (or second material layer) and the antiferromagnetic layer. Further, various kind of magnetic semiconductors may be used, and the underlayer may be a soft magnetic film (soft film) or a hard magnetic film (hard film). The recording layer may have a single-layer structure, a multilayer structure in which a plurality of different ferromagnetic layers are laminated as described above, or a multilayer structure in which a ferromagnetic layer and a nonmagnetic layer are laminated.

A material that forms a tunnel insulating film in the nonvolatile magnetic memory device having the magnetoresistance effect may be an insulating material, such as aluminum oxide (AlOx), aluminum nitride (AlN), magnesium oxide (MgO), magnesium nitride, silicon oxide, silicon nitride, TiO$_2$ or Cr$_2$O$_3$, Ge, NiO, CdO$_x$, HfO$_2$, Ta$_2$O$_5$, BN, or ZnS. The tunnel insulating layer, for example, may be obtained by oxidizing or nitriding a metal film formed by a sputtering method. More specifically, in the case of using aluminum oxide (AlO$_x$) or magnesium oxide (MgO) as an insulating material that forms the tunnel insulating film, for example, a method of oxidizing aluminum or magnesium formed by the sputtering method in the atmosphere, a method of plasma-oxidizing aluminum or magnesium formed in the sputtering method, a method of ICP-plasma-oxidizing aluminum or magnesium formed in the sputtering method, a method of naturally oxidizing aluminum or magnesium formed in the sputtering method in oxygen atmosphere, a method of oxidizing aluminum or magnesium formed in the sputtering method by oxygen radical, a method of irradiating the aluminum or magnesium formed in the sputtering method with ultraviolet rays when naturally oxidizing the aluminum or magnesium in the oxygen atmosphere, a method of forming a film of aluminum or magnesium by a reactive sputtering method, or a method of forming a film of aluminum oxide (AlOx) or magnesium oxide (MgO) by a sputtering method may be exemplified. Further, these layers may be formed by a sputtering method, an ion beam deposition method, a physical vapor deposition (PVD) method that is exemplified as a vacuum deposition method, a chemical vapor deposition (CVD) method that is represented by an ALD (Atomic Later Deposition) method, or the like.

A material that forms the first material layer or the second material layer may be a known material, and it is preferable to use a combination of a bismuth telluride material (specifically, for example, $Bi_2Te_3$, $Bi_2Te_{2.85}Se_{0.15}$), a bismuth antimony telluride material, an antimony telluride material (specifically, for example, $Sb_2Te_3$), a thallium telluride material, a bismuth selenide material (specifically, for example, $Bi_2Se_3$), a lead telluride material, a tin telluride material, a germanium telluride material, a silicon germanium material, a $Pb_{1-x}Sn_xTe$ compound, a bismuth antimony material, a zinc-antimony material (specifically, for example, $Zn_4Sb_3$), a cobalt antimony material (specifically, for example, $CoSb_3$), a silver-antimony-tellurium material (for example, $AgSbTe_2$), a TAGS (Telluride of Antimony, Germanium and Silver) compound, an Si—Ge material, a silicide material [Fe—Si material (specifically, for example, $\beta$-$FeSi_2$), an Mn—Si material (specifically, for example, $MnSi_2$), a Cr—Si material (specifically, for example, $CrSi_2$), an Mg—Si material (specifically, for example, $Mg_2Si$)], a Skutterudite material [$MX_3$ compound (where, M is Co, Rh, or Ir, and X is P, As, or Sb), an $RM'_4X_{12}$ compound (where, R is La, Ce, Eu, or Yb, and M' is Fe, Ru, or Os)], a boron compound [specifically, for example, $MB_6$ (where, M is alkali earth metal, such as Ca, Sr, or Ba, and a rare earth metal such as Y or the like)], a Si material, a Ge material, a calthrate compound, a Heusler compound, a half-Heusler compound, a rare earth Kondo semiconductor material, a transition metal oxide material (specifically, for example, $Na_xCoO_2$, $NaCo_2O_4$, or $Ca_3Co_4O_9$), a zinc oxide material, a titanium oxide material, a cobalt oxide material, $SrTiO_3$, an organic thermoelectric material (specifically, for example, polythiophene or polyaniline), a chrome alloy, constantan, and an aluminum alloy. The material of the thermoelectric member may deviate from stoichiometric composition. Further, among these materials, it is preferable to use a combination of a bismuth telluride material that behaves as a n-type semiconductor and a bismuth antimony telluride material that behaves as a p-type semiconductor. As a method of forming the first material layer or the second material layer, a plating method, a combination of a PVD method or a CVD method and patterning technique, or a lift-off method may be exemplified.

The nonvolatile memory device according to the embodiment of the present disclosure that includes the above-described shape and construction or the nonvolatile memory device that is obtained by the manufacturing method may be collectively called a "nonvolatile memory device according to the embodiment of the present disclosure" or the like. Further, the structure that is formed by laminating the first electrode, the first material layer having a positive Peltier coefficient, the information storage layer, the second material layer having a negative Peltier coefficient, and the second electrode may be called a "multilayer structure" for convenience.

According to the nonvolatile memory device according to the embodiment of the present disclosure, generally, a first wiring is provided below the multilayer structure, and a second wiring is provided to be in electrical contact with the upper side of the multilayer structure. The first electrode may be connected to the first wiring, and the second electrode may be connected to the second wire. Further, the second electrode may be connected to the first wire, and the first electrode may be connected to the second wire. The electrode may even serve as the first wire. Further, a selection transistor composed of a field effect transistor (FET) is further provided on the lower side of the multilayer structure, and the direction in which the second wire (for example, bit line) is extended may be orthogonal to the direction in which a gate electrode that includes the field effect transistor is extended, but is not limited thereto. The projection image in the direction in which the second wire is extended may be in parallel to the projection image in the direction in which the gate electrode that includes the field effect transistor is extended. According to circumstances, the selection transistor is not necessary.

In the case where the selection transistor that includes the field effect transistor is further provided on the lower side of the multilayer structure, as a more concrete construction, for example, although not limited thereto, a construction may be exemplified, which includes a selection transistor formed on a semiconductor substrate, a lower insulating layer (corresponding to a substrate) covering the selection transistor, and a first wire or a first electrode (second electrode) formed on the lower insulating layer, wherein the first wire or the first electrode (second electrode) is electrically connected to the selection transistor through a connection hole installed on the lower insulating layer (or the connection hole, a landing pad portion or a lower wire), an upper insulating layer covers the lower insulating layer and the first wire or the first electrode (second electrode) to surround the multilayer structure, and the second wire or the second electrode (first electrode) is formed on the upper insulating layer.

The first wire or the second wire has a single-layer structure of copper (Cu), aluminum (Al), gold (Au), platinum (Pt), titanium (Ti), Molybdenum (Mo), tantalum (Ta), tungsten (W), TiN, TiW, Wn, and silicide. Further, the first wire or the second wire may have a multilayer structure of an underlayer made of Cr or Ti and a Cu layer, an Au layer, and a Pt layer formed thereon. Further, the first wire or the second wire maybe constructed to have a single layer of Ta or a multilayer structure of Cu, Ti, and the like. These wires, for example, maybe formed in a PVD method that is exemplified as a sputtering method.

The selection transistor can be constructed, for example, by a known MIS type FET or an MOS type FET. The connection hole for electrically connecting the first wire or the first electrode (second electrode) and the selection transistor may be made of a polysilicon doped with impurities, a high melting metal or a metal silicide, such as tungsten, Ti, Pt, Pd, Cu, TiW, TiNW, $WSi_2$, or $MoSi_2$, and may be formed based on a CVD method or a PVD method such as a sputtering method. Examples of the constituent material of the lower insulating layer or the upper insulating layer include silicon oxide ($SiO_2$), silicon nitride (SiN), SiON, SOG, NSG, BPSG, PSG, BSG, and LTO.

[Embodiment 1]

Figure 2B:
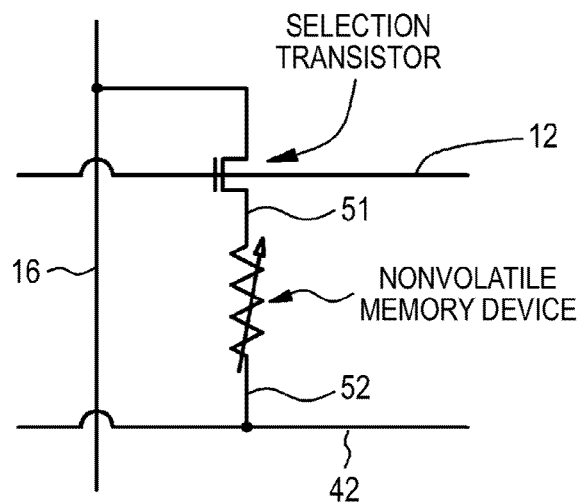

Embodiment 1 relates to a nonvolatile memory device and a manufacturing method thereof according to the embodiment of the present disclosure. A schematic partial cross-sectional view of a nonvolatile memory device according to embodiment 1 is shown in FIG. 1. Further, a cross-sectional structure of a multilayer structure that constitutes a nonvolatile memory device according to embodiment 1 is conceptually shown in FIG. 2A, and its equivalent circuit is shown in FIG. 2B.

A nonvolatile memory device according to embodiment 1 is configured by laminating a first electrode 51, a first material layer 53 having a positive Peltier coefficient, an information storage layer (information recording layer) 60, a second material layer 54 having a negative Peltier coefficient, and a second electrode 52. In this case, the first electrode 51, the first material layer 53, the information storage layer 60, the second material layer 54, and the second electrode 52 constitute a multilayer structure 50. Further, the information storage layer 60 stores information by changing the resistance value thereof. In the nonvolatile memory device according to embodiment 1, the first electrode 51 also serves as the first wire, and a second wire 42 is further provided to be electrically connected to the multilayer structure 50. In the illustrated example, the first electrode 51 forms a lower electrode, and the second electrode 52 forms an upper electrode. However, the second electrode 52 may form the lower electrode and the first electrode 51 may form the upper electrode.

A selection transistor TR composed of a field effect transistor is installed on the lower side of the multilayer structure 50. The direction in which the second wire (bit line) 42 is extended crosses at right angles the direction in which the gate electrode 12 that includes the field effect transistor (which functions as a so-called word line) is extended. Specifically, the selection transistor TR is formed in a portion of a silicon semiconductor substrate 10 that is surrounded by an isolation region 11, and is covered by lower insulating layers 21 and 23 which correspond to the substrate. One source/drain region 14B is connected to the first electrode 51 through a connection hole 22 that is formed of a tungsten plug. The other source/drain region 14A is connected to a sense line 16 through a tungsten plug 15. In the drawing, the reference numeral 13 denotes a gate insulating film.

In the nonvolatile memory device according to embodiment 1, the first material layer 53 is made of a p-type thermoelectric material, and the second material layer 54 is made of an n-type thermoelectric material. Specifically, the first material layer 53 is made of a bismuth antimony telluride material that behaves as a p-type semiconductor, and the second material layer 54 is made of a bismuth telluride material that behaves as an n-type semiconductor. Further, the first electrode 51 and the second electrode 52 is made of tungsten (W) or titanium (Ti). In this case, the first electrode 51, the first material layer 53, the information storage layer 60, the second material layer 54, and the second electrode 52 may be formed with the same size.

Further, the information storage layer 60 is formed of a resistance change layer that stores information by changing its resistance value. In embodiment 1, the resistance change layer is made of an ionic conductor that includes a metal. More specifically, the information storage layer (resistance change layer 60) is inserted between the first electrode (lower electrode) 51 and the second electrode (upper electrode) 52, and includes a high resistance layer 61 and an ionic source layer 62 from the first electrode side.

The ionic source layer 62 is formed of a conductive or semiconductive thin film (for example, a multilayer structure of a thin film made of GeSbTe, GeTe, GeSe, GeS, SiGeTe, or SiGeSbTe and a thin film made of Ag, Ag alloy, Cu, Cu alloy, Zn, or Zn alloy) which includes at least one kind of metallic element (atom) that is selected from the group consisting of Cu, Ag, and Zn and at least one kind of chalcogen (atom) that is selected from the group consisting of Te, S, and Se. Further, the high resistance layer 61 may be made of a metal material, a rare earth element, an oxide or a nitride of their mixture, or a semiconductor material. In embodiment 1, specifically, the ionic source layer 62 includes Cu and Te, and more specifically, the ionic source layer 62 includes CuZnTeAlGe, and the high resistance layer 61 is made of a gadolinium (Gd) oxide (GdOx). Here, Cu, Ag, and Zn are elements (atoms) which are easy to move in the inside of the ionic source layer 62 or in the inside of the high resistance layer 61 when they become cations. On the other hand, Te, S, and Se are elements (atoms) which can make the resistance value of the ionic source layer 62 become smaller than the resistance value of the high resistance layer 61 when current flows to the information storage layer 60. In the ionic source layer 62, Cu or the like is uses as an element that becomes a cation. Further, in the case of using Te or the like as chalcogen (atom), when the current flows to the information storage layer 60, the resistance value of the ionic source layer 62 can be sufficiently smaller than the resistance value of the high resistance layer 61, and further, since a portion whose resistance value is greatly changed can be limited to the ionic source layer 62, the stability of the memory operation can be improved. The ionic source layer 62 may have a multilayer structure including two layer or more. For example, in the case of two-layer structure, a thin layer that includes at least one kind of metallic element (atom) selected from the group consisting of Cu, Ag, and Zn and a conductive or semiconductive thin film that includes at least one kind of chalcogen (atom) selected from the group consisting of Te, S, and Se are provided. In this case, the thin film on the high resistance layer side may be composed of a thin layer that includes a metallic element (atom).

Further, the information storage layer 60 has a multilayer structure of the high resistance layer 61 and the ionic source layer 62. The high resistance layer 61 includes in the largest quantity telluride (Te) as an anion component, and the ionic source layer 62 includes at least one kind of metallic element as a positively ionizable element, and includes at least one kind of element (chalcogen) (atom) selected from the group consisting of tellurium (Te), sulfur (S), and selenium (Se) as a negatively ionizable element. Specifically, for example, the high resistance layer 61 may be made of AlTe, and the ionic source layer 62 may be made of CuTeZrAlGe.

In the nonvolatile memory device according to embodiment 1, if a voltage is applied between two electrodes, the electrical characteristics of the ionic source layer 62, such as a resistance value or a capacitance value, are changed, and thus the memory function can be developed using the change of the above-described characteristics. Further, metal atoms in the ionic source layer 62 are ionized and diffused into the high resistance layer 61. As a result, inside the high resistance layer 61, current paths that include many metal atoms are formed or defects are formed by the metal atoms to lower the resistance value of the high resistance layer 61. At this time, since the resistance value of the ionic source layer 62 is originally lower than the resistance value before the storage of information (data) in the high resistance layer 61, the resistance value of the whole nonvolatile memory device is lowered while the resistance value of the high resistance layer 61 is lowered to develop the memory function.

Hereinafter, the operation of the nonvolatile memory device according to embodiment 1 will be described in more detail.

[Writing of Information]

If a positive potential (plus potential) is applied to the second electrode 52 and a negative potential (minus potential) or a zero potential is applied to the first electrode 51, the metallic atoms from the ionic source layer 62 are ionized and diffused into the inside of the high resistance layer 61. As a result, inside the high resistance layer 61, current paths that include many metal atoms are formed or defects are formed by the metal atoms to lower the resistance value of the high resistance layer 61. At this time, since the resistance value of the ionic source layer 62 is originally lower than the resistance value before the storage of information (data) in the high resistance layer 61, the resistance value of the whole nonvolatile memory device is lowered while the resistance value of the high resistance layer 61 is lowered. That is, the nonvolatile memory device becomes in anon state (turned-on state). The resistance of the whole nonvolatile memory device at that time becomes the writing resistance.

Thereafter, when the application of a voltage to the first electrode 51 and the second electrode 52 is stopped, the resistance value of the nonvolatile memory device is retained in a low state. In this way, information (data) is recorded (written).

[Erasing of Information]

If the negative potential is applied to the second electrode 52 and the positive potential or zero potential is applied to the first electrode 51, the current paths or defects disappear from the inside of the high resistance layer 61, and the resistance value of the high resistance layer 61 is heightened. At this time, since the resistance value of the ionic source layer 62 is originally low, the resistance value of the whole nonvolatile memory device is heightened while the resistance value of the high resistance layer 61 is heightened. That is, the nonvolatile memory device becomes in an off state (turned-off state). The resistance of the whole nonvolatile memory device at that time becomes the erasing resistance.

Thereafter, if the voltage supply to the first electrode 51 and the second electrode 52 is stopped, the resistance value of the nonvolatile memory device is retained in high state. By doing so, erasing of information (data) is performed.

By repeating the above-described process, the recording (writing) of information on the nonvolatile memory device and the erasing of the recorded information can be repeatedly performed.

For example, by making the state where the resistance of the whole nonvolatile memory device becomes the writing resistance (low resistance value state) correspond to information "1" and making the state where the resistance of the whole nonvolatile memory device becomes the erasing resistance (high resistance value state) correspond to information "0", respectively, the information that is stored in the nonvolatile memory device can be changed from "0" to "1" by applying the positive potential to the second electrode 52, and the information that is stored in the nonvolatile memory device can be changed from "1" to "0" by applying the negative potential to the second electrode 52.

[Reading of Information]

In order to perform reading of the recorded information, for example, the positive potential is applied to the second electrode 52 and the negative potential or zero potential is applied to the first electrode 51. However, the positive potential value that is applied to the second electrode 52 is set to be lower than the positive potential value that is applied to the second electrode 52 during the recording of the information. By this, the high and low states of the resistance value of the nonvolatile memory device can be seen, and the information stored in the nonvolatile memory device can be read. At this time, in so far as the resistance value can be read, the applying of the positive potential is not limited to the second electrode 52, and may be performed to the first electrode 51.

As described above, according to embodiment 1, since the recording and erasing of the information is performed using the nonvolatile memory device having a simple structure in which the first electrode 51, the second material layer 53, the high resistance layer 61, the ionic source layer 62, the second material layer 54, and the second electrode 52 are sequentially laminated, the recording and erasing of the information can be easily performed even if the nonvolatile memory device is miniaturized. Further, even if there is no power supply, the resistance value of the information storage layer 60 can be retained, and thus the information can be saved for a long time. Further, since the resistance value of the information storage layer 60 is not changed due to the reading, it is not necessary to perform a fresh operation, and thus the power consumption can be reduced by that much.

Generally, with respect to the trouble (lifetime) of the semiconductor device, the temperature dependence of stress on the semiconductor device has been widely used in accelerated lift testing, or the like according to the Arrhenius model. Here, if it is assumed that the reaction speed constant is $K_0$, the Arrhenius model can be expressed as in Equation (1) (for example, see Hiroshi Shiomi, "Introduction to Physical Failure", JUSE Press, 1970).

$$K_0 = A \cdot \exp[-E_a/(k \cdot T)] \tag{1}$$

Here, $E_a$ denotes activation energy, k denotes a Boltzmann constant, T denotes an absolute temperature, and A denotes a constant.

In the nonvolatile memory device according to embodiment 1, the resistance value of the information storage layer 60 is changed by applying a voltage V between the first electrode 51 and the second electrode 52, and the data (information) is stored by retaining the low resistance state or the high resistance state. As a mechanism for a lifetime for retaining the resistance state, the data retention lifetime model is considered by applying the above-described Arrhenius model. Here, in the case of considering the characteristic voltage that makes the apparent activation energy $E_a$ becomes "0" when $V=V_0$, Equation (1) may be modified as in Equation (2).

$$\tau = \tau_0 \cdot \exp[\{E_a/(k \cdot T)\} \cdot (1 - V/V_0)] \tag{2}$$

Here, $\tau$ denotes a lifetime to maintain a low resistance state (data retention lifetime), $\tau_0$ denotes a frequency factor, T denotes a temperature of an information storage layer 60, and V denotes a voltage that is applied between a first electrode and a second electrode.

Further, by adding a temperature $a \cdot V^2$ (a is constant), which is caused by Joule heat according to the applied voltage V, with respect to the term (k·T), based on the following Equation (3), it can be known that the data retention lifetime decrease symptoms, which are caused by an electric field and Joule heat, can be explained by overall.

$$\tau = \tau_0 \cdot \exp[(E_a/\{k(a \cdot V^2 + T)\}) \cdot (1 - V/V_0)] \tag{3}$$

Figure 3:
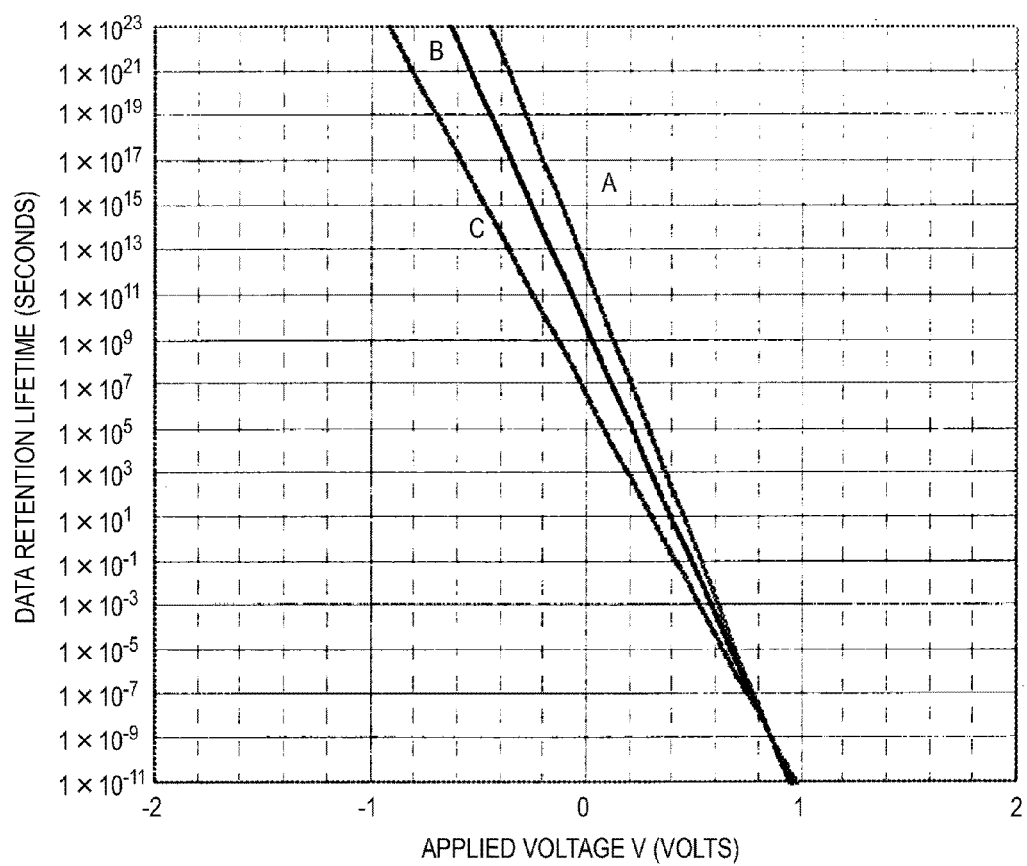
FIG. 3 is a graph showing the obtained relationship between an applied voltage and a data retention lifetime based on Equation (2)
Figure 4:
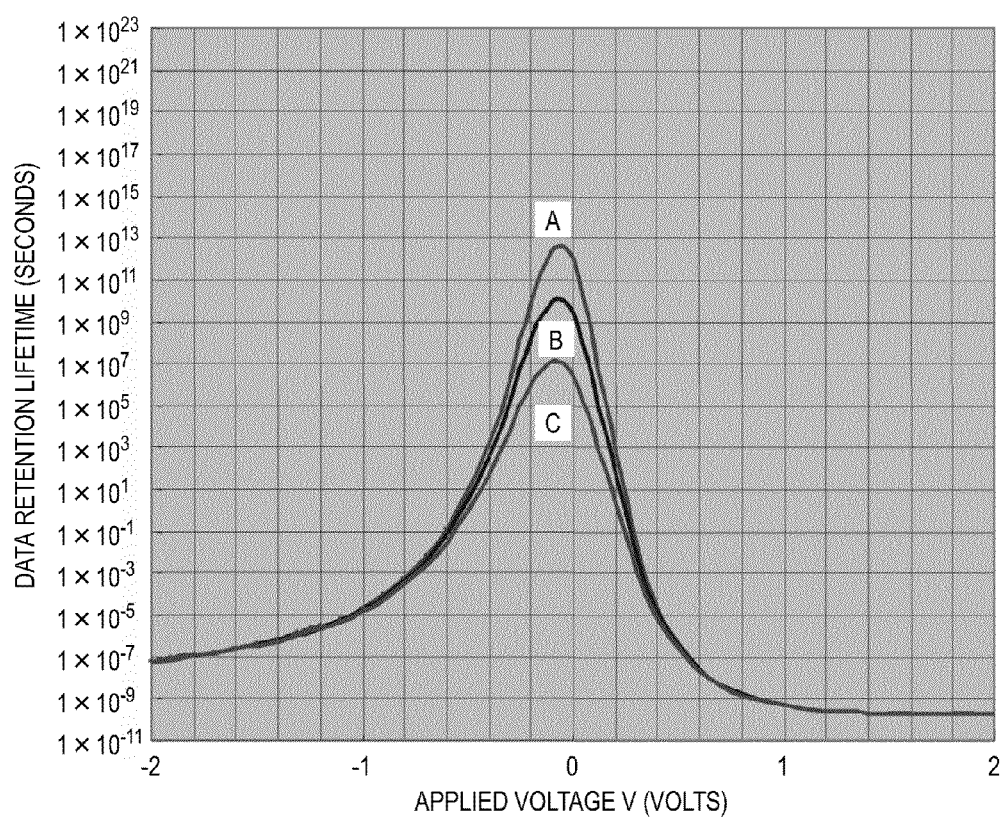
FIG. 4 is a graph showing the obtained relationship between an applied voltage and a data retention lifetime based on Equation (3)

The result of calculation of Equation (2) is shown in FIG. 3, and the result of calculation of Equation (3) is shown in FIG. 4. "A" in FIGS. 3 and 4 and FIG. 5 to be described later represents the result of calculation when the temperature T is T=−10° C., "B" represents the result of calculation when the temperature T is T=20° C., and "C" represents the result of calculation when the temperature T is T=85° C. In this case, respective parameter values in Equation (3) when the results as shown in FIG. 4 are obtained are as follows.

k=8.62×10⁻⁵ (eV/K)
$\tau_0$=1.00×10⁻⁹ (seconds)
$E_a$=1.1 (eV)
a=2500 (K/V²)
$V_0$=0.86 (V)

From this result of calculation, it can be known that if the voltage V that is applied to the nonvolatile memory device in the low resistance state is close to 0 V, the data retention lifetime becomes longest, while if a higher voltage is applied, the data retention lifetime is shortened and the resistance state is inverted to the high resistance state. Here, it is noted that due to the influence of the term $a \cdot V^2$ that is caused by Joule heat in Equation (3), the data retention lifetime is shortened even if the voltage V is applied in any direction of a positive direction (the direction in which the second electrode becomes positive and the first electrode becomes negative) and a negative direction (the direction in which the first electrode becomes positive and the second electrode becomes negative).

For example, although it is designed that the resistance value is changed from the low voltage state (set state) of +1 V to the high voltage state (reset state), in the case of performing the reading of the low resistance state (set state) at a voltage of +0.3 V, the reading voltage is repeatedly applied, and thus the data may be inverted due to the temperature increase of the information storage layer 60 that is caused by Joule heat.

However, according to the Peltier effect, by inserting the information storage layer 60 between the first material layer (p-type thermoelectric material layer) 53 having the positive Peltier coefficient and the second material layer (n-type thermoelectric material layer) 54 having the negative Peltier coefficient, and making current flow from the second electrode 52 to the first electrode 51, the heat that is generated in the information storage layer 60 can be absorbed in the first electrode 51 and the second electrode 52. This principle is represented in Equation (4).

$$Q = \Pi_{AB} \cdot I = (\Pi_B - \Pi_A) \cdot I \quad (4)$$

Here, $\Pi$ denotes a Peltier coefficient, $\Pi_{AB}$ denotes a Peltier coefficient of the entire of eth first material layer 53, the information storage layer 60, and the second material layer 54, $\Pi_B$ denotes a Peltier coefficient of the material that forms the first material layer 53, and $\Pi_A$ denotes a Peltier coefficient of the material that forms the second material layer 54.

Further, in consideration of heat radiation term by the Peltier effect, Equation (5) can be derived from Equation (3) and Equation (4).

$$\tau = \tau_0 \cdot \exp[(E_a/\{k(a \cdot V^2 - \Pi_{AB} \cdot I + T)\}) \cdot (1 - V/V_0)] \quad (5)$$

Figure 5:
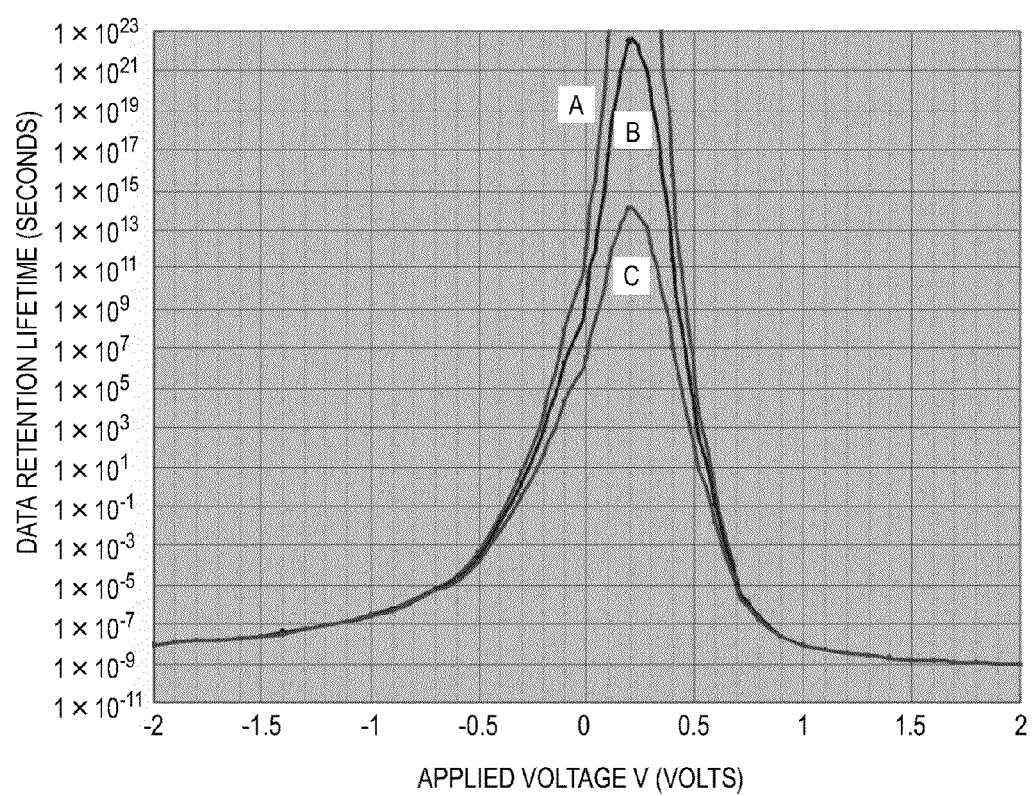
FIG. 5 is a graph showing the obtained relationship between an applied voltage and a data retention lifetime based on Equation (5)
Figure 6A:
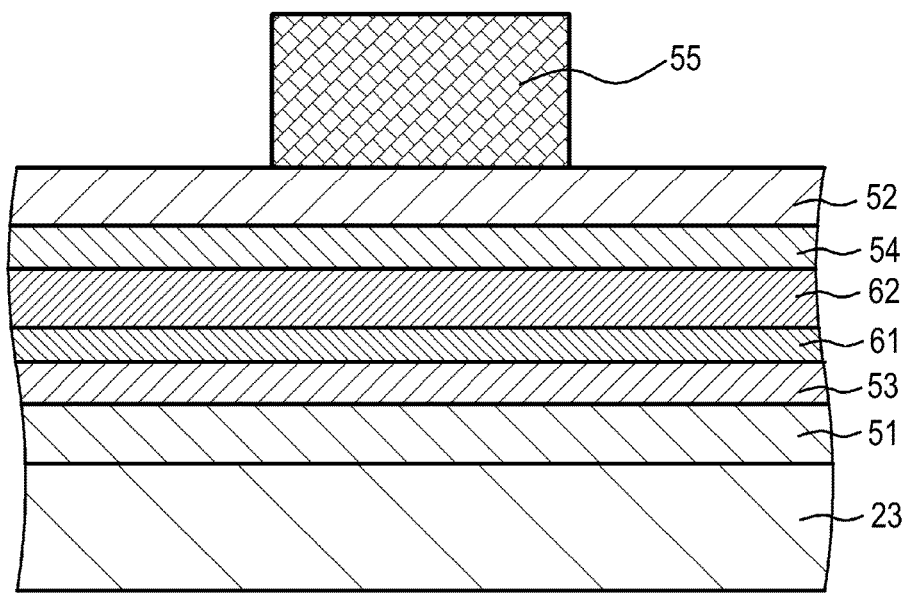
FIGS. 6A and 6B are schematic partial cross-sectional views of a first magnetic material layer or the like, explaining a method of manufacturing a nonvolatile memory device according to embodiment 1.
Figure 6B:
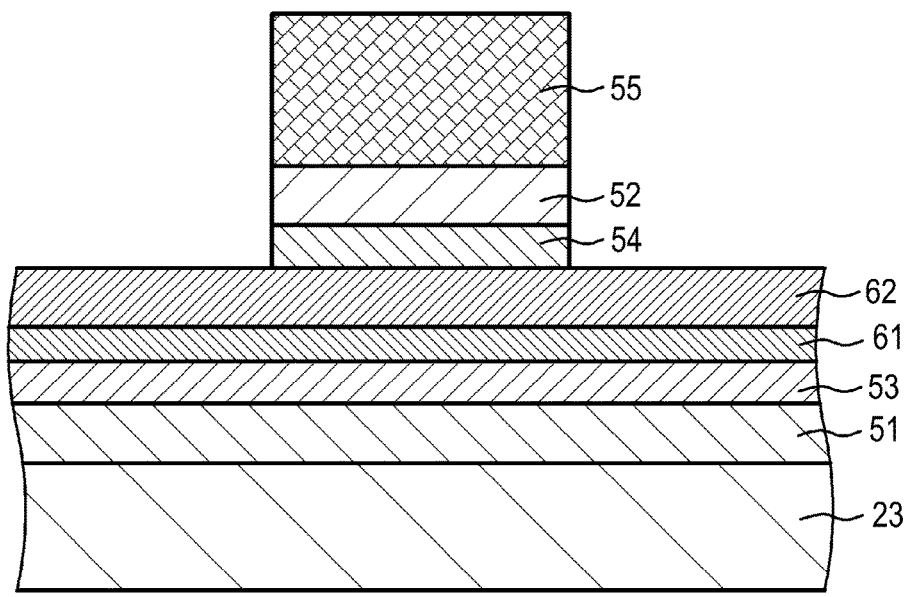

Based on Equation (5), the simulation result of the relationship between the applied voltage V and the data retention lifetime is shown in FIG. 5. Respective parameter values in Equation (5) when the result as shown in FIG. 5 is obtained are as follows.

$k = 8.62 \times 10^{-5}$ (eV/K)
$\tau_0 = 1.00 \times 10^{-9}$ (seconds)
$E_a = 1.1$ (eV)
$a = 2500$ (K/V$^2$)
$V_0 = 1.9$ (V)
$\Pi_{AB} = 2.03 \times 10^7$ (K/A)
$I = 1.20 \times 10^{-5}$ (A)

From FIG. 5, it can be seen that the data retention lifetime $\tau$ is maximized in the case where about +0.2 V is applied. That is, by reading the information through applying of the above-described voltage to the first electrode 51 and the second electrode 52, read disturbance can be avoided. If a higher voltage is applied, the electric field effect is increased, and comparing FIG. 4 and FIG. 5 with each other, almost the same data retention lifetime is obtained at +0.1 V. That is, in the case of transition to the high resistance state, there is almost no influence of heat radiation caused by the Peltier effect, and the achievable switching speed is comparable to that in the related art. Further, in the high resistance state, almost no current flows, and thus the heat radiation by the Peltier effect is suppressed. Further, transition from the high resistance state to the low resistance state makes the direction of the applied voltage and the current flowing direction reversed, and at this time, heat radiation (heating) occurs in the information storage layer by the Peltier effect, and a higher speed switching can be expected. In the nonvolatile memory device according to embodiment 1, the information storage layer 60 is inserted between the first material layer 53 having the positive peltier coefficient and the second material layer 54 having the negative Peltier coefficient, and thus the temperature increase of the information storage layer due to Joule heat can be suppressed when current flows from the second electrode 52 to the first electrode 51 in order to read the information stored in the nonvolatile memory device. Accordingly, the read disturbance tolerance can be improved while the transition speed of the resistance change is retained or improved. These principle and effect are valid to all resistance change nonvolatile memory device having the principle of performing switching based on the voltage, current or Joule heat.

Hereinafter, a method of manufacturing a nonvolatile memory device according to embodiment 1 will be described with reference to FIGS. 6A, 6B, 7A, 7B, and 8. According to the method of manufacturing a nonvolatile memory device according to embodiment 1, the first electrode 51, the first material layer 53 having the positive Peltier coefficient, the information storage layer 60, the second material layer 54 having the negative Peltier coefficient, and the second electrode 52 are sequentially formed on the substrate. In the drawings, illustration of constituent elements (selection transistor TR and the like) of the nonvolatile memory device which are positioned below the first electrode 51 and the illustration of the connection hole 22 are omitted.

[Process-100]

First, based on a known method, an isolation region 11 is formed on the silicon semiconductor substrate 10, and a selection transistor TR that includes a gate oxide film 13, a gate electrode 12, and source/drain regions 14A and 14B is formed on a portion of the silicon semiconductor substrate 10 that is surrounded by the isolation region 11. Then, a first lower insulating layer 21 is formed, a tungsten plug 15 is formed on a portion of the first lower insulating layer 21 on the upper side of the source/drain region 14A, and a sense line 16 is formed on the first lower insulating layer 21. Thereafter, a second lower insulating layer 23 that corresponds to the substrate is formed over the whole surface, and a connection hole 22 that includes a tungsten plug is formed on the portion of the lower insulating layers 21 and 23 on the upper side of the source/drain region 14B. By doing so, the selection transistor TR that is covered by the lower insulating layers 21 and 23 is obtained. Thereafter, a first electrode 51 that is connected to the connection hole 22 is formed on the lower insulating layer 23 that corresponds to the substrate by a sputtering method (see FIG. 1).

[Process-110]

Thereafter, on the first electrode 51, the first material layer 53, a high resistance layer 61 made of a gadolinium (Gd) oxide with a thickness of 3 nm, the ionic source layer 62 including Cu and Te with a thickness of 10 nm, the second material layer 54, and the second electrode 52 are sequentially formed by a sputtering method.

[Process-120]

Then, a mask layer 55 is formed on the second electrode 52. More specifically, in order to form the mask layer 55, a SiO$_2$ layer with a thickness of 50 nm is formed on the second electrode 52 by a bias high-density plasma CVD (HDP-CVD) method. Then, a patterned resist layer is formed on the $SiO_2$ layer, the patterned mask layer 55 is obtained by etching the $SiO_2$ layer by lithography technology and a dry etching method, and then the resist layer is removed by an oxygen plasma ashing process and an organic cleaning process. Then, using the mask layer 55 as a mask, the second electrode 52 and the second material layer 54 are patterned based on the RIE method (see FIG. 6B).

[Process-130]

Thereafter, a portion 60' of the information storage layer 60 that is not covered by the mask layer 55 is oxidized (resistance change layer invalidation process), and then the portion 60' of the oxidized information storage layer 60 is reduced.

Figure 7A:
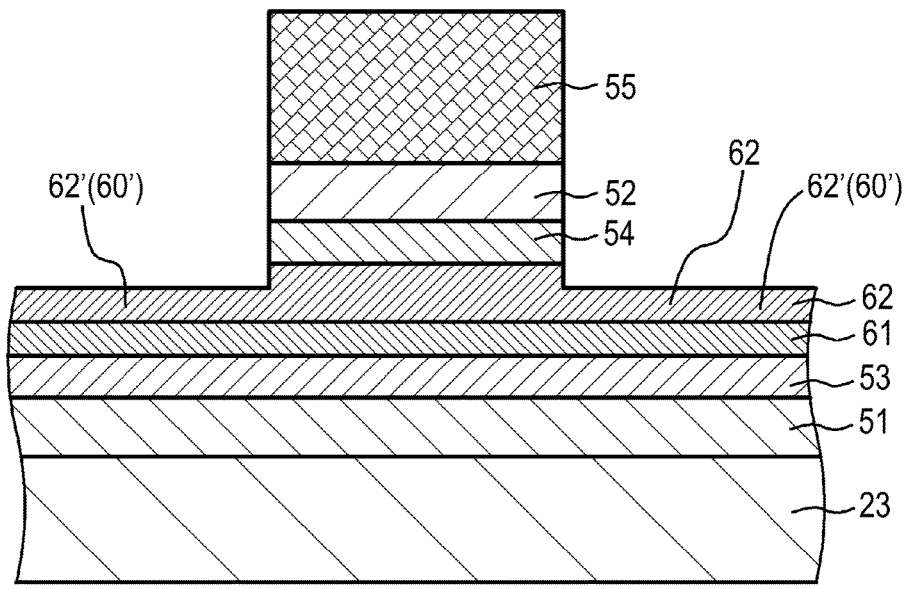
FIGS. 7A and 7B are schematic partial cross-sectional views of a first magnetic material layer or the like, explaining a method of manufacturing a nonvolatile memory device according to embodiment 1 to follow FIG. 6B.
Figure 7B:
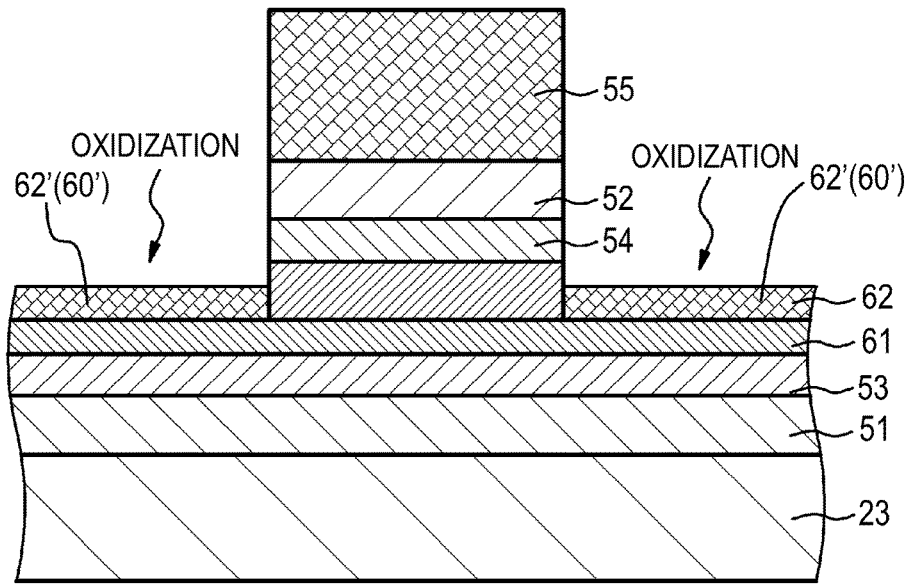
Figure 8:
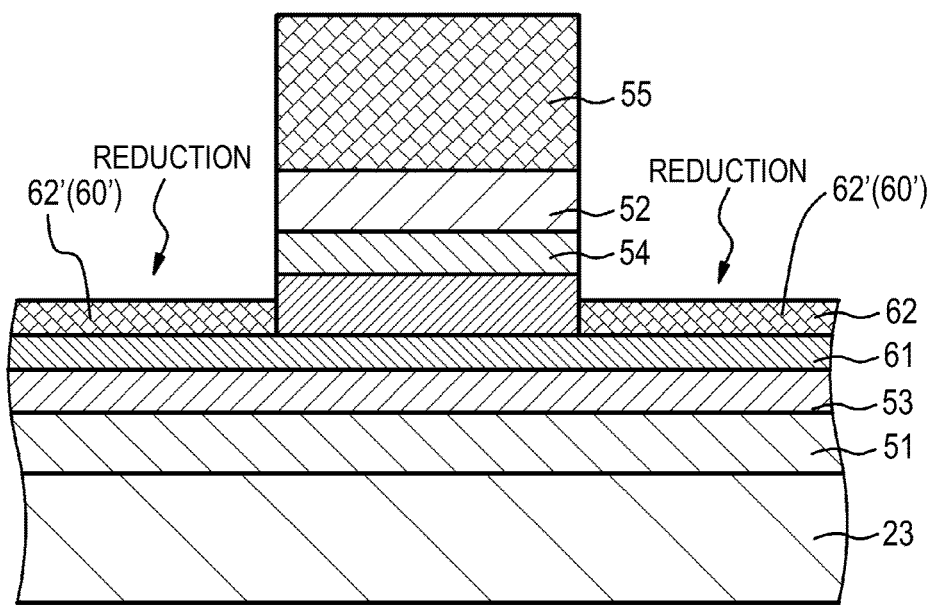
FIG. 8 is a schematic partial cross-sectional view of a first magnetic material layer or the like, explaining a method of manufacturing a nonvolatile memory device according to embodiment 1 to follow FIG. 7B.

Specifically, about a half of the ionic source layer 62 is etched based on an ion milling method (see FIG. 7A). Here, in the etching process of the ionic source layer 62, it is preferable to adjust the processing conditions so that a part of the ionic source layer 62 remains on the whole wafer surface. However, partially, no particular problem occurs even if apart of the high resistance layer 61 that is a lower layer is exposed. Further, instead of patterning the ionic source layer 62 in the ion milling method, the ionic source layer 62 may be patterned based on the RIE method. Next, the remaining layer 62' of the ionic source layer 62 is oxidized based on the plasma oxidization method (see FIG. 7B). Thereafter, a reduction process is executed with respect to the remaining layer 62' of the ionic source layer 62 (see FIG. 8). Specifically, a hydrogen plasma method ($H_2$ plasma reduction processing method) is executed.

[Process-140]

Then, a resist layer (not illustrated) is formed on the remaining layer 62' of the ionic source layer 62 based on the lithography technology, and then using the resist layer as an etching mask, the remaining layer 62' of the ionic source layer 62, the high resistance layer 61, the first material layer 53, and the first electrode 51 are patterned (etched) to remove the resist layer. Next, the upper insulating layer 30 that is formed of a SiN layer is formed on the whole surface by a plasma CVD method, and then the upper insulating layer 30 and the mask layer 55 are smoothed by a chemical mechanical polishing (CMP) method to expose the second electrode 52. Thereafter, based on a known method, the second wire 42 is formed on the upper insulating layer 30. By doing so, the nonvolatile memory device according to embodiment 1 as illustrated in FIG. 1 can be obtained.

In the method of manufacturing a nonvolatile memory device according to embodiment 1, the portion 60' of the information storage layer 60 that is not covered by the mask layer 55 is oxidized, and then the portion 60' of the oxidized information storage layer 60 is reduced. That is, the unnecessary portion of the information storage layer 60 is not removed by patterning using an etching method or the like, but the function (conductivity) that the information storage layer 60 has is deteriorated by oxidization. Accordingly, it is difficult that the region of the information storage layer 60 maintaining the function is damaged. Further, since the portion 60' of the oxidized information storage layer 60 is reduced, the information storage layer 60 is prevented from being damaged through the thermal diffusion of excessive oxygen that remains in the portion 60' of the information storage layer 60 that is caused by the processing temperature or the like in the manufacturing process after the oxidization process of the nonvolatile memory device. That is, the occurrence of deterioration in the function region due to the oxygen can be prevented. In this case, the portion 60' of the information storage layer 60, the function (conductivity or the like) of which is deteriorated due to the oxidization, is not restored even by the reduction process. As the result, the difference of the resistance value change of the nonvolatile memory device can be reduced, and thus the nonvolatile memory device having high characteristics and a long-term reliability can be provided. According to circumstances, unnecessary portion of the information storage layer 60, the first material 53, and the first electrode 51 may be removed by patterning using the etching method.

Embodiment 2

Embodiment 2 is a modification of embodiment 1. In embodiment 1, the first electrode 51 and the second electrode 52 are made of the same material. On the other hand, in embodiment 2, the material that forms the first electrode 51 is different from the material that forms the second electrode 52, and the Seebeck coefficient of the material that forms the first electrode 51 is different from the Seebeck coefficient of the material that forms the second electrode 52. Specifically, the first electrode 51 is made of gold (Au, the Seebeck coefficient: 6.5 μV/K), and the second electrode 52 is made of platinum (Pt, the Seebeck coefficient: 0 μV/K). By constructing as described above, the cooling capability of the whole nonvolatile memory device can be improved, and thus the read disturbance tolerance can be much more improved.

Embodiment 3

Embodiment 3 is also a modification of embodiment 1. In embodiment 3, the nonvolatile memory device is formed of a phase change memory device (PRAM). That is, in embodiment 3, the resistance change layer is made of a chalcogenide material. Further, the phase change memory device is operated as a nonvolatile memory device using the fact that the phase change material that forms the information storage layer (resistance change layer) has different electrical resistances of several orders depending on whether the phase change material is in an amorphous state or in a crystal state. Specifically, if a pulse type large current (for example, 200 mA, 20 ns) flows to the memory unit for a short time, and then the memory device is cooled rapidly, the phase change material that forms the resistance change layer becomes in an amorphous state, and indicates a high resistance. On the other hand, if a pulse type small current (for example, 100 mA, 100 ns) flow to the resistance change layer for a relatively long time and then the memory device is cooled slowly, the phase change material that forms the resistance change layer becomes in a crystalline state, and indicates a low resistance.

In this case, the resistance change layer may be made of a chalcogenide material composed of a metal, such as GeSbTe, ZnSe, or GsSnTe, and a compound such as Se or Te. Further, for example, the resistance change layer may be formed of a material having the colossal electro-resistance effect (CER effect), for example, a ternary perovskite phase type transition metal oxide ($PrCaMnO_3$ or $SrTiO_3$), or a binary transition metal oxide (CiO, NiO, CuO, $TiO_2$, or $Fe_3O_4$).

For example, in the case of forming the resistance change layer with $TiO_2$, if a forming process for initially applying a high voltage to the nonvolatile memory device is executed, a plurality of current paths (filaments) having a low resistance of the resistance change layer is locally formed. In the "reset" procedure, the anode side (the side that applies a positive voltage) is oxidized by the applied voltage, and thus the resistance value is increased to be in a high resistance state. That is the nonvolatile memory device is in an off state (turned-off state). At this time, the resistance of the whole nonvolatile memory device becomes an erasing resistance. In the "setting" procedure, the anode side of the filament is reduced by Joule heat, and the resistance value is lowered to be in a low resistance state. As a result, the resistance value of the whole nonvolatile memory device is also lowered. That is, the nonvolatile memory device becomes in an on state (turned-on state). The resistance of the whole nonvolatile memory device at that time becomes the recording resistance. By repeating the above-described process, the recording (writing) of information on the nonvolatile memory device and the erasing of the recorded information can be repeatedly performed.

Even in the nonvolatile memory device according to embodiment 3, since the information storage layer is inserted between the first material layer having the positive Peltier coefficient and the second material layer having the negative Peltier coefficient, if current flows from the second electrode to the first electrode in order to red the information stored in the nonvolatile memory device, the temperature increase of the information storage layer due to the Joule heat can be suppressed. Accordingly, the occurrence of the read disturbance phenomenon in which the resistance state is changed while reading of the information is repeated can be prevented.

Although preferred embodiments of the present disclosure have been described, the present disclosure is not limited thereto. In the embodiments, various kinds of multilayer structure and the used materials are exemplary, and may be appropriately modified. In the nonvolatile memory device, the information storage layer may be constructed as a multilayer structure in which the first magnetic material layer, the tunnel insulating film, and the second magnetic material layer are sequentially laminated, and the information is stored by changing the electrical resistance value in dependent on the magnetization inversion state.

The present disclosure contains subject matter related to that disclosed in Japanese Priority Patent Application JP 2010-231214 filed in the Japan Patent Office on Oct. 14, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile memory device comprising:
   first and second electrodes including first and second materials, respectively;
   a conductive plug under the first and second electrodes, the conductive plug being electrically connected to the first electrode;
   a bit line above the first and second electrodes, the bit line being electrically connected to the second electrode;
   a first layer between the first and second electrodes;
   a second layer between the first layer and the second electrode;
   an information storage layer between the first and second layer,
   wherein,
   the first layer has a positive Peltier coefficient,
   the second layer has a negative Peltier coefficient,
   the information storage layer includes (a) resistance change layer that stores information as a changed electrical resistance value, and (b) an ionic source layer on the resistance change layer, the ionic source layer being a source of ions when an electrical potential is applied across the first and second electrodes,
   the ionic source layer has a first portion and a second portion,
   the first portion of the ionic source layer is between the resistance change layer and the second layer, with the second electrode being over the second layer,
   the second portion of the ionic source layer is on the resistance change layer but the second layer and the second electrode are not disposed over the second portion of the ionic source layer,
   the second portion of the ionic source layer is oxidized while the first portion of the ionic source layer is not oxidized, and
   the second portion of the ionic source layer is less thick than the first portion of the ionic source layer.

2. The nonvolatile memory device according to claim 1, wherein the first layer is made of a p-type thermoelectric material, and the second layer is made of an n-type thermoelectric material.

3. The nonvolatile memory device according to claim 1, wherein a Seebeck coefficient of the first material of the first electrode is different from a Seebeck coefficient of the second material of the second electrode.

4. The nonvolatile memory device according to claim 1, wherein:
   the first material of the first electrode is a material selected from the group consisting of silver, gold, copper, lead, palladium, platinum, titanium, titanium nitride, and tungsten, and
   the second material of the second electrode is a material selected from the group consisting of silver, gold, copper, lead, palladium, platinum, titanium, titanium nitride, and tungsten.

5. The nonvolatile memory device according to claim 1, wherein the ionic source layer includes an ionic conductor that includes a metal.

6. A method of manufacturing a nonvolatile memory device comprising:
   sequentially forming, on a substrate:
   (a) a conductive plug,
   (b) a first electrode including a first material,
   (c) a first layer having a positive Peltier coefficient,
   (d) an information storage layer including (i) a resistance change layer that stores information as a changed electrical resistance value, and (ii) an ionic source layer on the resistance change layer, the ionic source layer being a source of ions,
   (e) the second layer having a negative Peltier coefficient,
   (f) a second electrode including a second material, and
   (g) a bit line,
   wherein,
   the ionic source layer has a first portion and a second portion,
   the first portion of the ionic source layer is formed between the resistance change layer and the second layer, with the second electrode being formed over the second layer,
   the second portion of the ionic source layer is formed on the resistance change layer but the second layer and the second electrode are not formed over the second portion of the ionic source layer,
   after the ionic source layer is formed, the second portion of the ionic source layer is oxidized while the first portion of the ionic source layer is not oxidized, and
   after being oxidized, the second portion of the ionic source layer is reduced in thickness to be less thick than the first portion of the ionic source layer.

7. The method of claim 6, wherein the first layer is formed of a p-type thermoelectric material, and the second layer is formed of an n-type thermoelectric material.

8. The method of claim 6, wherein a Seebeck coefficient of the first material of the first electrode is different from a Seebeck coefficient of the second material of the second electrode.

9. The method of claim 6, wherein:
   the first material of the first electrode is a material selected from the group consisting of silver, gold, copper, lead, palladium, platinum, titanium, titanium nitride, and tungsten, and
   the second material of the second electrode is a material selected from the group consisting of silver, gold, copper, lead, palladium, platinum, titanium, titanium nitride, and tungsten.

10. The method of claim 6, wherein the ionic source layer includes an ionic conductor that includes a metal.

11. The nonvolatile memory device according to claim 1, wherein the second portion of the ionic source layer is about half as thick as the first portion of the ionic source layer.

12. The nonvolatile memory device of according to claim 1, wherein:
   the second portion of the ionic source layer has a first part and a second part, and
   along a direction parallel to a surface of the second layer that faces the ionic source layer, the first and second parts of the second portion are respectively disposed on two sides of the first portion the ionic source layer.

13. The method according to claim 6, wherein the second portion of the ionic source layer is reduced in thickness to be about half as thick as the first portion of the ionic source layer.

14. The method according to claim 6, wherein:
   the second portion of the ionic source layer has a first part and a second part, and
   along a direction parallel to a surface of the second layer that faces the ionic source layer, the first and second parts of the second portion are respectively disposed on two sides of the first portion the ionic source layer.

* * * * *